(12) United States Patent
Barrow

(10) Patent No.: US 8,319,540 B2
(45) Date of Patent: Nov. 27, 2012

(54) APPARATUSES AND METHODS FOR A VOLTAGE LEVEL SHIFTING

(75) Inventor: Jeffrey G. Barrow, Tucson, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 217 days.

(21) Appl. No.: 12/803,681

(22) Filed: Jul. 1, 2010

(65) Prior Publication Data

US 2012/0001672 A1    Jan. 5, 2012

(51) Int. Cl.
    *H03L 5/00*      (2006.01)
(52) U.S. Cl. ........................................ 327/333
(58) Field of Classification Search ............... 327/333
See application file for complete search history.

(56) References Cited

U.S. PATENT DOCUMENTS

| | | | |
|---|---|---|---|
| 4,532,436 A | 7/1985 | Bismark | |
| 4,980,583 A | 12/1990 | Dietz | |
| 6,049,228 A | 4/2000 | Moon | |
| 6,084,459 A | 7/2000 | Jeong | |
| 6,107,857 A | 8/2000 | Orisaka et al. | |
| 6,522,323 B1 | 2/2003 | Sasaki et al. | |
| 6,617,907 B2 * | 9/2003 | Kamata | 327/333 |
| 6,888,394 B2 | 5/2005 | Cleary et al. | |
| 7,038,521 B2 | 5/2006 | Cleary et al. | |
| 7,071,758 B2 | 7/2006 | Tseng et al. | |
| 7,397,278 B2 | 7/2008 | Nakao | |
| 2007/0164805 A1 | 7/2007 | Horibata et al. | |
| 2008/0238523 A1 | 10/2008 | Thorp et al. | |

OTHER PUBLICATIONS

Tran et al., "Low-Power High-Speed Level Shifter Design for Block-Level Dynamic Voltage Scaling Environment," Institute of Industrial Science and Center for Collaborative Research, University of Tokyo, 4-6-1 Komaba, Meguro-ki, Tokyo, 153-8505 Japan, {canh,kawapy,tsakurai}@iisu-tokyo.ac.jp, pp. 1-4.

* cited by examiner

*Primary Examiner* — Lincoln Donovan
*Assistant Examiner* — Daniel Rojas
(74) *Attorney, Agent, or Firm* — Traskbritt, P.C.

(57) ABSTRACT

Level shifting circuits and a related method are disclosed herein. An embodiment of the present invention includes a voltage level shifter, comprising a first pull up transistor coupled to a high voltage signal and a first pull down transistor coupled between the first pull up transistor and a low voltage signal and controlled by an input signal. The voltage level shifter further includes a first bias transistor serially coupled between the first pull up transistor and the first bias transistor. A gate of the first bias transistor is coupled with a bias voltage signal. The voltage level shifter further includes a first additional pull up path coupled with the high voltage signal and a first node between the first pull up transistor and the first pull down transistor, and an output signal associated with the first node. The output signal is a level shifted voltage responsive to the input signal.

7 Claims, 14 Drawing Sheets

APPARATUSES AND METHODS FOR A VOLTAGE LEVEL SHIFTING

TECHNICAL FIELD

Embodiments of the present disclosure relate generally to voltage level shifting and, more particularly, to apparatuses and methods related to high voltage shifters that may have reduced output delays.

BACKGROUND

Level shift circuits (also referred to herein as level shifters) change the voltage level of a signal. For example, when an output voltage of a first circuit differs from an operating range of a second circuit, a level shifter is arranged between the first circuit and the second circuit, and the voltage level of the signal between the first and second circuits is adjusted. For example, in the driving circuitry for a liquid crystal display (LCD) panel, such as those using thin film transistors (TFT), signals having various voltages may be employed. In this case, signals having different voltages are generated from a common power supply, and one or more level shift circuits are provided to adjust the levels of the signals between circuit blocks having different voltages.

FIG. 1A illustrates a schematic diagram of a conventional level shift circuit 100. Conventional level shift circuit 100 includes transistors 110, 120, 130, inverter 105, and resistor 135. Transistor 110 and transistor 120 are operably coupled such that the drains of the two transistors 110, 120 are operably coupled. The source of transistor 120 is operably coupled with a relatively low voltage ($V_{LOW}$), which may be, for example, ground. The source of the transistor 110 is operably coupled with the supply voltage ($V_{HIGH}$). Transistor 130 is operably coupled in series with a resistor 135, such that the drain of the transistor 130 is coupled with an end of the resistor 135. The other end of the resistor 135 is operably coupled with $V_{HIGH}$. The source of transistor 130 is operably coupled with $V_{LOW}$. The gate of the transistor 110 is operably coupled with the node between the resistor 135 and the drain of the transistor 130. Level shifter 100 also includes an inverter 105 operably coupled with the gate of transistor 120.

An input signal ($V_{IN}$) may be applied to level shifter 100 at the gate of transistor 130. $V_{IN}$ may also be applied to the inverter 105, such that the voltage signal applied to the gate of transistor 120 is the inverted signal of $V_{IN}$. In operation, if $V_{IN}$ is asserted (i.e., has a high voltage relative to $V_{LOW}$), transistor 130 is activated, which causes the voltage applied to the gate of transistor 110 to be approximately equal to $V_{LOW}$. As a result, transistor 110 is also activated and $V_{OUT}$ is approximately equal to $V_{HIGH}$. On the other hand, if $V_1$ is not asserted (i.e., has a voltage near $V_{LOW}$), transistor 130 is deactivated, which causes a high voltage applied to the gate of transistor 110. As a result, transistor 110 is deactivated. With $V_{IN}$ not asserted, the voltage applied to the gate of transistor 120 through inverter 105 is asserted, which activates transistor 120 and causes $V_{OUT}$ to be approximately equal to $V_{LOW}$.

FIG. 1B is an output waveform 150 illustrating the output signal $V_{OUT}$ being generated in response to the input signal $V_{IN}$ for the conventional level shift circuit 100 of FIG. 1A. As shown in FIG. 1B, at time $t_1$, $V_{IN}$ transitions from high to low (i.e., asserted to deasserted). For example, $V_{IN}$ may be approximately equal to $V_{DD}$ and transition to $V_{LOW}$ (e.g., 0V) at time $t_1$. As a result, $V_{OUT}$ transitions from $V_{HIGH}$ to $V_{LOW}$ at time $t_2$. The difference between the time that $V_{IN}$ transitions (i.e., $t_1$) and the time that $V_{OUT}$ transitions (i.e., $t_2$) from a high voltage to a low voltage may be the output falling time delay.

At time $t_3$, $V_{IN}$ transitions from low to high. As a result, $V_{OUT}$ transitions from $V_{LOW}$ to $V_{HIGH}$ between times $t_3$ and $t_5$. At time $t_4$, $V_{OUT}$ crosses the voltage midpoint between $V_{LOW}$ and $V_{HIGH}$, which midpoint is approximately ($V_{HIGH}$+ $V_{LOW}$)/2. The difference between the time that $V_{IN}$ transitions (i.e., $t_3$) and the time that $V_{OUT}$ transitions (i.e., $t_5$) from a low voltage to a high voltage may be the output rising time delay. Output rising time delay may be determined from a different voltage level than time $t_5$ when $V_{OUT}$ is approximately equal to $V_{HIGH}$. For example, one measure of the output rising time delay may be considered when $V_{OUT}$ crosses the voltage midpoint between $V_{LOW}$ and $V_{HIGH}$ (i.e., at time $t_4$).

As shown in FIG. 1B, the input signal $V_{IN}$ is shifted successfully from an asserted signal ($V_{DD}$) with a lower voltage to an output signal ($V_{OUT}$) with a higher voltage ($V_{HIGH}$), and which $V_{OUT}$ may control or otherwise operate compatible high voltage circuit functions. As shown in FIG. 1B, $V_{IN}$ may have an input voltage swing ranging from $V_{LOW}$ to $V_{DD}$. $V_{OUT}$ has a different voltage swing ranging from $V_{LOW}$ to $V_{HIGH}$.

One problem with the conventional level shift circuit 100 is that the output rising time delay may be relatively long— especially when compared to the output falling time delay. A relatively long output rising time delay may constrain system clock speeds. For example, the output rising time delay of the conventional level shift circuit 100 in FIG. 1A may constrain an integrated circuit to operate at a relatively low maximum clock frequency (e.g., 100 MHz), when the other circuit elements of the integrated circuit may otherwise be able to operate at a relatively greater frequency (e.g., 1 GHz).

The output rising time delay of the conventional level shift circuit 100 may be decreased by decreasing the resistance of the resistor 130. However, decreasing resistor 130 may also increase the standby current ($I_{SB}$) that flows through the resistor 130 when the transition is complete (i.e., level shifter 100 is in a quiescent state) and $V_{OUT}$ is approximately equal to $V_{HIGH}$. As a result, the power dissipated by the conventional level shifter 100 may increase during the quiescent state. The inventor has appreciated that there exists a need for a level shifter designed to reduce delays while maintaining relatively low shoot-through current and/or minimal standby current.

BRIEF SUMMARY OF THE INVENTION

Embodiments of the present invention include a voltage level shifter, comprising a first pull up transistor operably coupled to a high voltage signal and a first pull down transistor operably coupled in series between the first pull up transistor and a low voltage signal. The first pull down transistor is controlled by an input signal and having a stronger drive than the first pull up transistor. The voltage level shifter further includes a first bias transistor serially coupled between the first pull up transistor and the first pull down transistor. A gate of the first bias transistor is coupled with a bias voltage signal. The voltage level shifter further includes a first additional pull up path operably coupled with the high voltage signal and a first node between the first pull up transistor and the first bias transistor, and an output signal associated with the first node, wherein the output signal is a level shifted voltage responsive to the input signal.

Another embodiment of the present invention includes an integrated circuit, comprising a plurality of semiconductor devices, and a level shifting circuit. The level shifting circuit comprises a first pull up transistor and a second pull up transistor with drains and gates cross coupled with each other, a first bias transistor and a second bias transistor each with gates coupled with a bias voltage signal, a first pull down transistor controlled by an inverted version of an input signal and operably coupled in series with the first pull up transistor with the first bias transistor therebetween, and a second pull down transistor controlled by the input signal and operably coupled in series with the second pull up transistor with the second bias transistor therebetween. Each line of serially coupled transistors may operate between a high voltage signal and a low voltage signal. The level shifting circuit further comprises a first additional pull up path operably coupled with the high voltage signal and a first node between the first bias transistor and the first pull down transistor, a second additional pull up path operably coupled with the high voltage signal and a second node between the second pull up transistor and the second bias transistor, and an output signal associated with at least one of the first node and the second node. The output signal may be a level shifted voltage responsive to the input signal.

Another embodiment of the present invention includes a method for shifting an input voltage level to a different output voltage level. The method comprises pulling down a voltage on an output node of a level shifter in a relatively faster manner than pulling up a voltage on an output node responsive to an input signal, pulling up a voltage on the output node with at least both of a pull up transistor and an additional pull up path responsive to the input signal, turning off the additional pull up path as a voltage on the output node increases above a threshold level, and generating a voltage level shifted output on the output node that is a voltage level different than the input signal. Turning off the additional pull up path is accomplished through a direct connection between the output node and a gate of a control transistor of the additional pull up path.

Yet another embodiment of the present invention includes a level shifting circuit, comprising a first node coupling a first pull up circuit and a first pull down circuit. The first pull down circuit is responsive to an input signal and the first pull up circuit is further coupled to a high voltage signal and the first pull down circuit is coupled to a low voltage signal. The level shifting circuit further includes a first additional pull up path including a first transistor serially coupled with a second transistor, the first transistor coupled to a high voltage signal and the second transistor coupled to the first node. A gate of the second transistor is also directly coupled to the first node. The level shifting circuit further includes an output signal associated with the first node, wherein the output signal is configured to generate a level shifted voltage in response to the input signal.

DETAILED DESCRIPTION

Figure 1A:
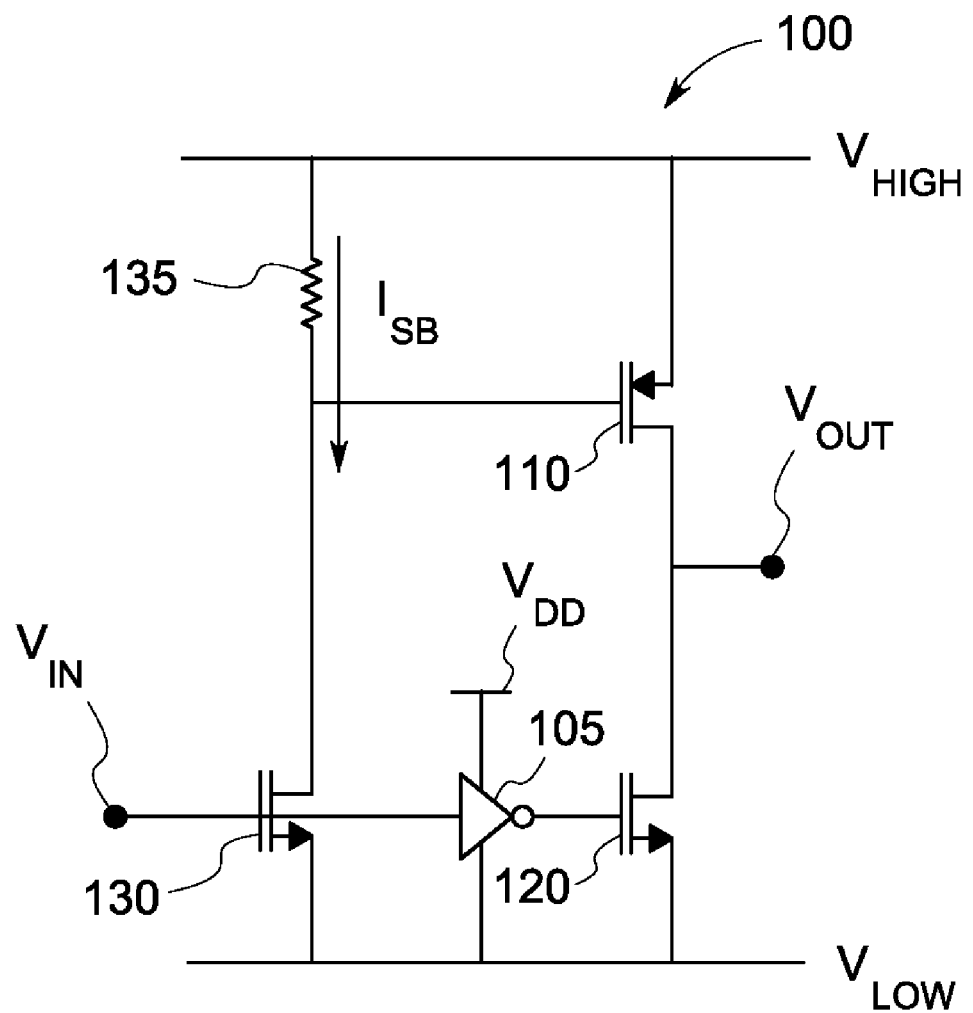
FIG. 1A illustrates a conventional level shifter.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Reference is made throughout this description regarding a transistor being "weak" or "strong." The terms "weak" and "strong" are relative terms to describe the relative drain current drives for a given gate-to-source voltage ($V_{GS}$) for the different transistors within a level shift circuit. Thus, a weak transistor has a relatively weak drain current drive. A strong transistor has a relatively strong drain current drive. A weak transistor may have characteristics consistent with weakening the drive, wherein such characteristics may include a relatively small gate width and a large gate length relative to the gate of a stronger transistor. A strong transistor may have characteristics consistent with strengthening the drive of a transistor, wherein such characteristics may include relatively large gate width and a small gate length relative to the gate of a weaker transistor.

As described herein, in certain embodiments (e.g., FIG. 7), the relative pull up strength of a transistor may be affected by coupling a resistor in series with the drain of a transistor. Coupling a resistor in series with the drain of a transistor may effectively weaken the ability of the transistor to hold the gate of the cross-coupled transistor high, and may be performed in the alternative to, or in addition to altering the relative drive characteristics of the transistors. In other words, a weak transistor may refer to a transistor in which the drive may have been relatively weakened by altering the characteristics of the transistors, by coupling a resistor with the drain of the transistor, by a combination of both, or through other methods for weakening the drive or effectively weakening the relative pull up strength of a transistor as known in the art.

References are also made throughout the disclosure regarding components being "high voltage" devices or "low voltage" devices. High voltage devices and low voltage devices are also relative terms to describe the voltage swings that may potentially be experienced by the given device, and for which the given device is designed for safe operation across the gate to source voltage ($V_{GS}$), the drain to source ($V_{DS}$), the gate to drain ($V_{SD}$), the gate to backgate ($V_{GBG}$), the drain to backgate ($V_{DBG}$), or the source to backgate ($V_{SBG}$) of the device. For example, a transistor may experience a low voltage swing such as those common as inputs in digital devices (e.g., 1.8V, 2.5V, 3.3V). Another high voltage transistor may be designed to safely operate and experience a high voltage swing relative to the low voltage swing.

The terms "activated" and "deactivated" refer to state of a transistor in response to a voltage applied to the gate of the transistor. An activated (i.e., active) transistor is a transistor that has been turned on, or in other words, is conducting with a current from the source to the drain, as in the case of a PMOS transistor. A deactivated (i.e., inactive) transistor is a transistor that has been turned off, or in other words, is not conducting a current therethrough. Thus, the terms "activated," "active," and "turned on" may, at time, be used interchangeably herein. Similarly, the terms "deactivated," "inactive," and "turned off" may, at times, be used interchangeably herein.

Embodiments of the present disclosure include apparatuses and methods for level shifting. Although some examples used herein may describe level shifters implemented in TFT panels for LCDs, embodiments of the present disclosure should not be viewed as so limited. Rather, embodiments may be implemented as a driver of a load in many applications in which voltage level shifting may be desirable. Examples of such applications may include switching converters such as buck and boost converters, TFT level shifters, or other applications, which may require level shifting from low voltage digital control to high voltage output signals. Such level shifters may be implemented in applications such as cell phones, audio and video players, computers, televisions, and other applications that include high-speed digital circuits.

Figure 2A:
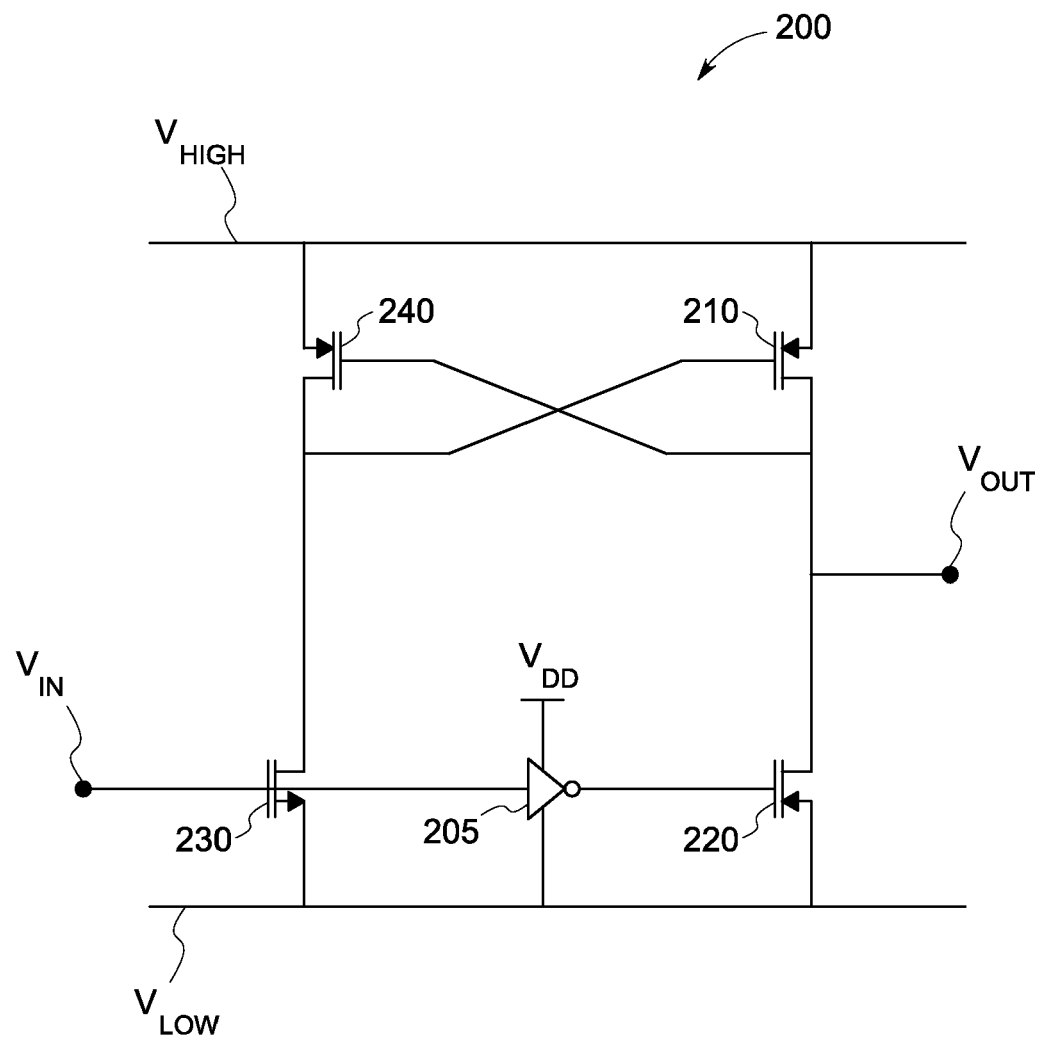
FIG. 2A illustrates a schematic diagram of a level shifter.

FIG. 2A illustrates a schematic diagram of a level shifter 200. Level shifter 200 includes transistor 210 operably coupled (e.g., connected) in series with transistor 220 such that the drains of the two transistors are operably coupled. The source of transistor 220 is operably coupled with $V_{LOW}$ (e.g., ground). The source of the transistor 210 is operably coupled with $V_{HIGH}$. $V_{HIGH}$ may also be referred to herein as the shift voltage, as the $V_{HIGH}$ is the voltage that the level shifter 200 uses to adjust (i.e., shift) the voltage level on the output signal ($V_{OUT}$).

Level shifter 200 also includes transistor 230 operably coupled in series with transistor 240, such that the drains of the two transistors are operably coupled. The source of the transistor 240 is operably coupled with the supply voltage $V_{HIGH}$. The source of transistor 230 is operably coupled with $V_{LOW}$. Transistor 210 and transistor 240 are cross-coupled such that the gates of each transistor 210, 240 are operably coupled with the respective drain of the other transistor 240, 210.

Level shifter 200 also includes an inverter 205 operably coupled with the gate of transistor 220. An input signal ($V_{IN}$) may be applied to level shifter 200 at the gate of transistor 230. $V_{IN}$ may also be applied to the inverter 205, such that the voltage signal applied to the gate of transistor 220 is the inverted signal of $V_{IN}$.

In operation, if $V_{IN}$ is asserted, a low voltage signal is applied to the gate of transistor 220 through inverter 205. As a result, transistor 220 is deactivated. With $V_{IN}$ asserted, transistor 230 is activated, which activation pulls the voltage applied to the gate of transistor 210 to $V_{LOW}$. As a result of voltage applied to the gate of transistor 210 being pulled to $V_{LOW}$, the transistor 210 is activated. With transistor 210 activated, the output signal ($V_{OUT}$) may be approximately equal to $V_{HIGH}$. If $V_{OUT}$ is approximately equal to $V_{HIGH}$, transistor 240 is held in an inactive state, allowing transistor 210 to remain active. Thus, with $V_{IN}$ asserted, the voltage level of an input signal $V_{IN}$ may be successfully shifted to result in an output signal equal $V_{OUT}$ to be approximately equal to $V_{HIGH}$.

On the other hand, if $V_{IN}$ is not asserted, a high voltage signal applied to the gate of transistor 220. As a result, transistor 220 is activated. With transistor 220 in an active state, $V_{OUT}$ may be pulled to be approximately equal to $V_{LOW}$. With $V_{OUT}$ approximately equal to $V_{LOW}$, $V_{LOW}$ is also applied to the gate of transistor 240, which activates transistor 240. With transistor 240 activated, $V_{HIGH}$ may be applied to the gate of transistor 210. With $V_{HIGH}$ being applied to the gate of transistor 210, transistor 210 is deactivated, and $V_{OUT}$ is held to be approximately equal to $V_{LOW}$.

Figure 2B:
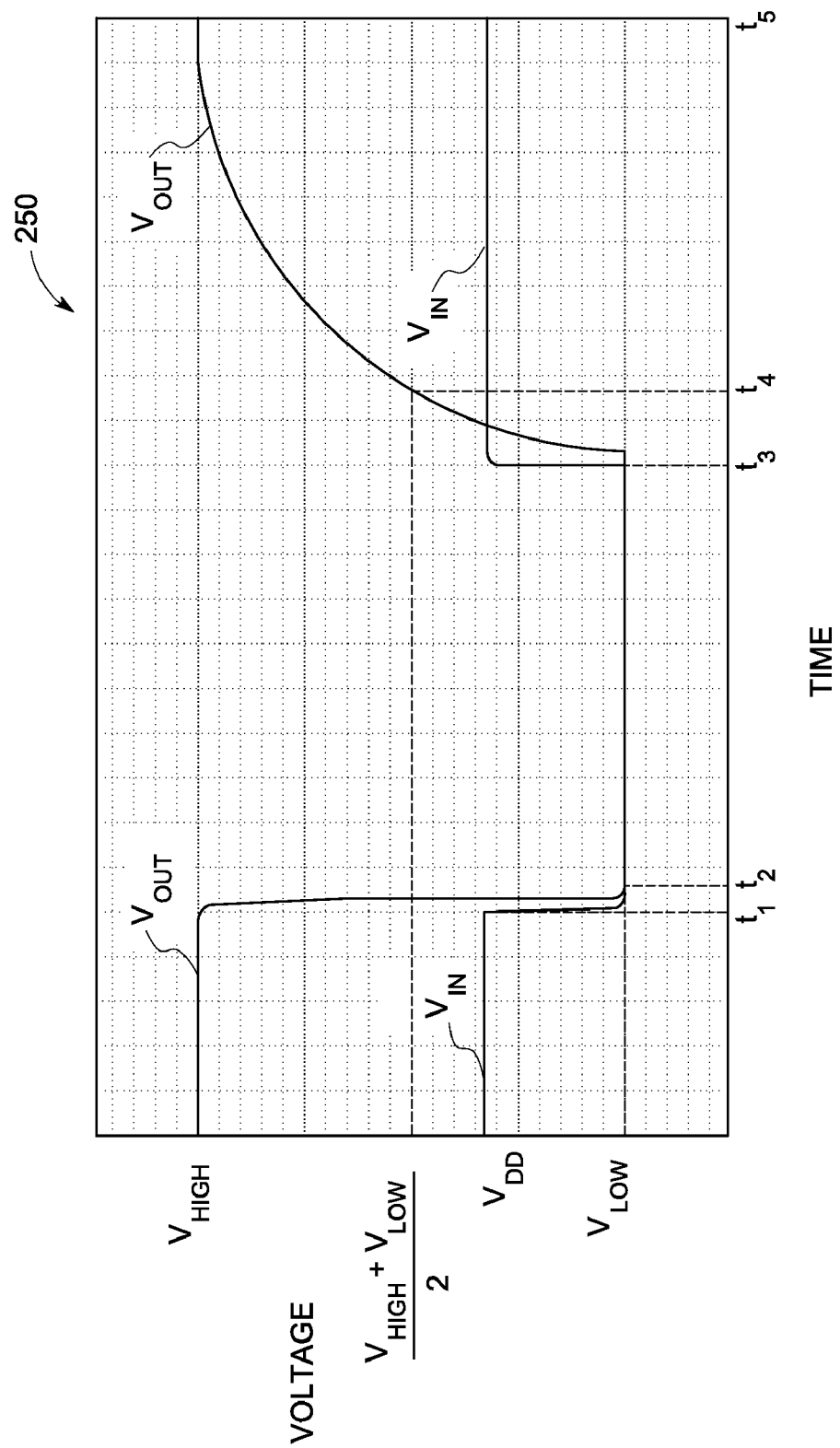
FIG. 2B is an output waveform illustrating the output signal $V_{OUT}$ being generated in response to the input signal $V_{IN}$ for the level shifter of FIG. 2A.

FIG. 2B is an output waveform 250 illustrating the output signal $V_{OUT}$ being generated in response to the input signal $V_{IN}$ for the level shifter 200 of FIG. 2A. As shown in FIG. 2B, at time $t_1$, $V_{IN}$ transitions from high to low (i.e., asserted to deasserted). For example, $V_{IN}$ may be approximately equal to $V_{DD}$ and transition to $V_{LOW}$ (e.g., 0V) at time $t_1$. As a result, $V_{OUT}$ transitions from $V_{HIGH}$ to $V_{LOW}$ at time $t_2$. The difference between the time that $V_{IN}$ transitions (i.e., $t_1$) and the time that $V_{OUT}$ transitions (i.e., $t_2$) from a high voltage to a low voltage may be the output falling time delay.

At time $t_3$, $V_{IN}$ transitions from low to high. As a result, $V_{OUT}$ transitions from low to high between times $t_3$ and $t_5$. At time $t_4$, $V_{OUT}$ crosses the voltage midpoint between $V_{LOW}$ and $V_{HIGH}$, which midpoint is approximately $(V_{HIGH}+V_{LOW})/2$. The difference between the time that $V_{IN}$ transitions (i.e., $t_3$) and the time that $V_{OUT}$ transitions (i.e., $t_5$) from a low voltage to a high voltage may be the output rising time delay. Output rising time delay may be determined from a different voltage level than time $t_5$ when $V_{OUT}$ is approximately equal to $V_{HIGH}$. For example, one measure of the output rising time delay may be considered when $V_{OUT}$ crosses the voltage midpoint between $V_{LOW}$ and $V_{HIGH}$ (i.e., at time $t_4$).

As shown in FIG. 2B, the input signal $V_{IN}$ successfully is shifted from an asserted signal ($V_{DD}$) with a lower voltage to an output signal ($V_{OUT}$) with a higher voltage ($V_{HIGH}$), and which $V_{OUT}$ may control or otherwise operate compatible high voltage circuit functions. As shown in FIG. 2B, $V_{IN}$ may have an input voltage swing ranging from $V_{LOW}$ to $V_{DD}$. $V_{OUT}$ has a different voltage swing ranging from $V_{LOW}$ to $V_{HIGH}$.

Figure 1B:
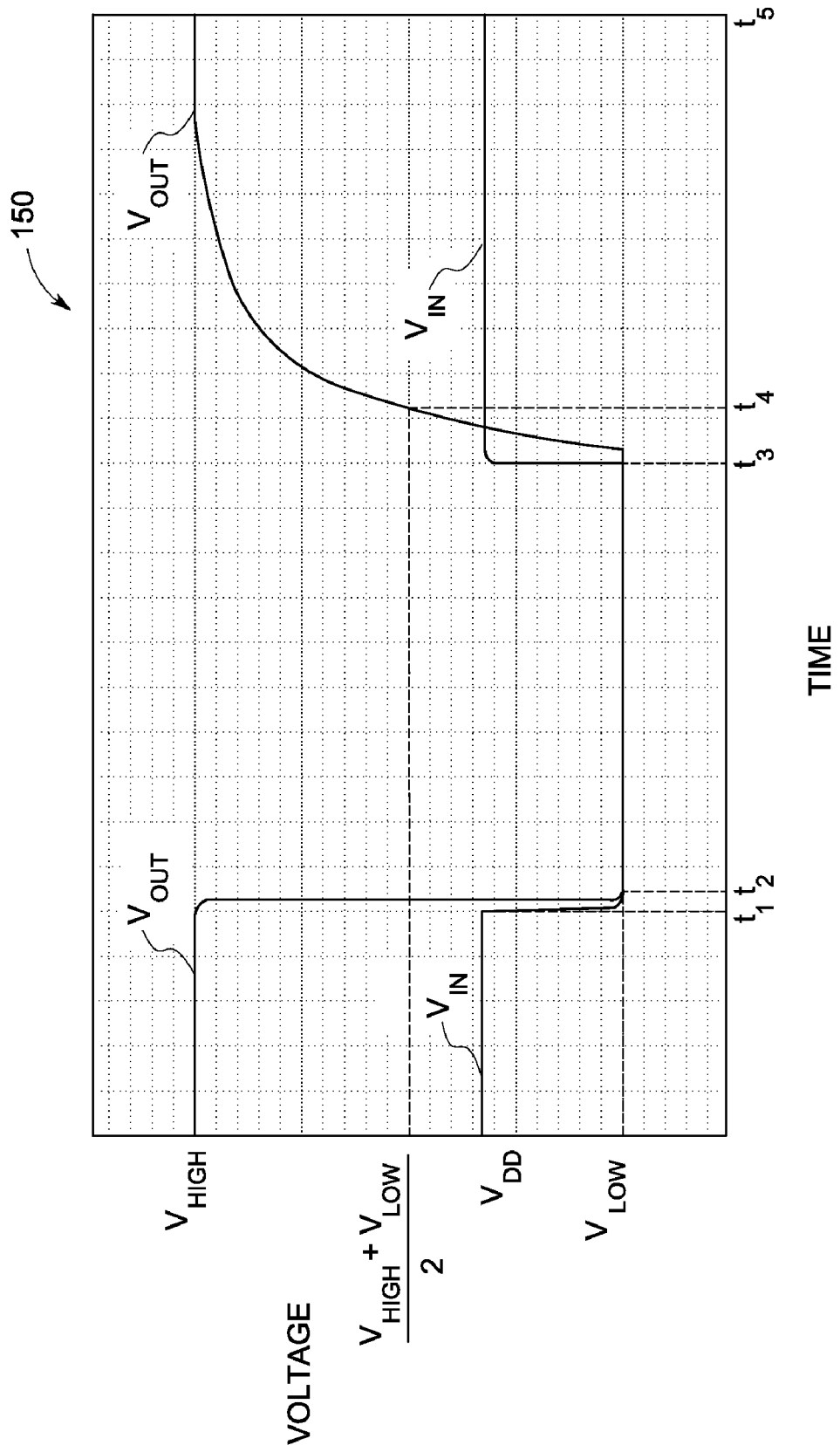
FIG. 1B is an output waveform illustrating the output signal $V_{OUT}$ being generated in response to the input signal $V_{IN}$ for the conventional level shift circuit of FIG. 1A.

Level shifting with level shifter 200 may require little, if any, standby current ($I_{SB}$ in FIG. 1). However, like with the level shifter 100 of FIG. 1A, the output rising time delay for the level shifter 200 of FIG. 2A may be relatively long—especially when compared to the output falling time delay. A relatively long output rising time delay may constrain system clock speeds.

Figure 2C:
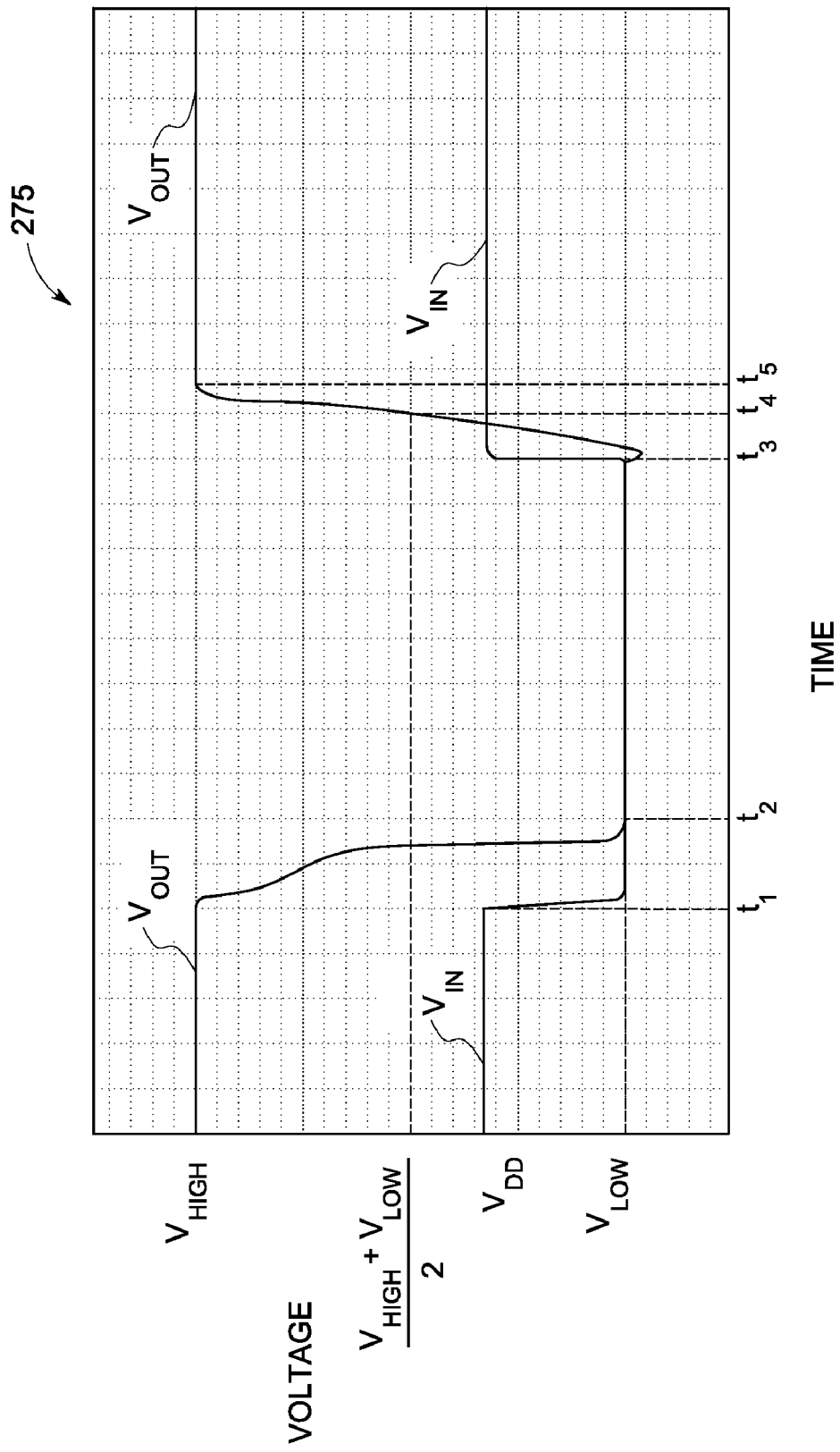
FIG. 2C is an output waveform illustrating the output signal $V_{OUT}$ being generated in response to the input signal $V_{IN}$ for the level shift circuit of FIG. 2A when the relative drives of transistors are altered as described in an alternative embodiment thereof.

FIG. 2C is an output waveform 150 illustrating the output signal $V_{OUT}$ being generated in response to the input signal $V_{IN}$ for the level shift circuit 200 of FIG. 2A when the relative drives of transistors 210 and 240 are altered as described in an alternative embodiment thereof. For example, the drives of transistors 210 and 240 may be adjusted relative to the drives of transistors 220 and 230 such that the transitions of $V_{OUT}$ from $V_{LOW}$ to $V_{HIGH}$ may be accelerated. For example, if transistors 210 and 240 are strong relative to transistors 220 and 230, then $V_{OUT}$ may transition faster when the transition is from low to high, thus decreasing the output rising time delay. Decreasing the output rising time delay for $V_{OUT}$ is indicated as a steeper transition by $V_{OUT}$ between time $t_3$ and time $t_5$. However, as shown in FIG. 2C, because the relative strength of the transistors is stronger, the output falling time delay (i.e., time for $V_{OUT}$ to transition from high to low) may be adversely affected. For example, the output voltage signal $V_{OUT}$ may be skewed between time $t_1$ and time $t_2$.

Figure 3A:
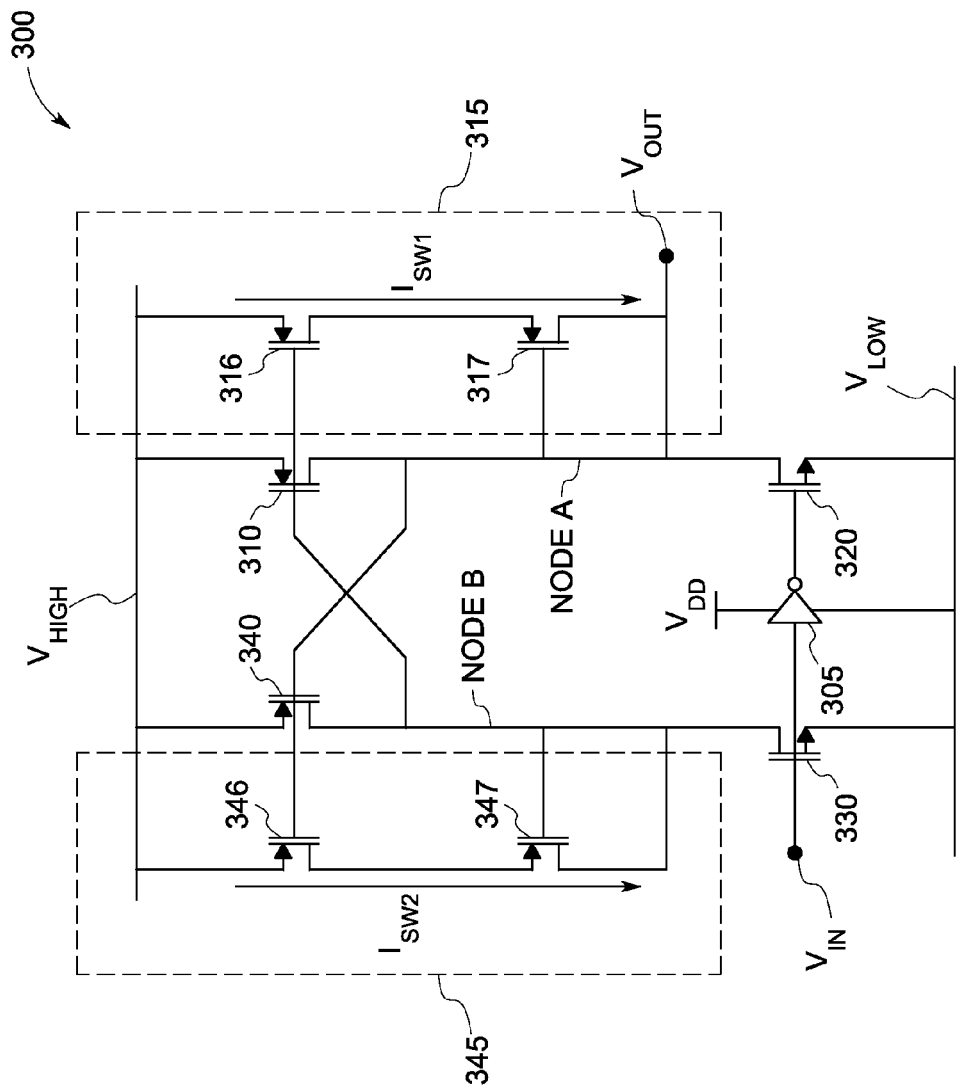
FIG. 3A illustrates a schematic diagram of a level shifter according to an embodiment of the present invention.

FIG. 3A illustrates a schematic diagram of a level shifter 300 according to an embodiment of the present invention. Level shifter 300 includes transistors 310, 320, 330, 340, and inverter 305 configured in a similar manner as described with reference to FIG. 2A. For example, transistors 310 and 320 are serially coupled, transistors 330 and 340 are serially coupled, and transistors 310 and 340 are cross-coupled as previously described. Level shifter 300 further includes additional pull up paths 315 and 345. Additional pull up paths 315 and 345 may include transistors 316, 317, and transistors 346, 347 respectively.

First additional pull up path 315 may be operably coupled between $V_{HIGH}$ and NODE A, NODE A being shown as the node located between transistor 310 and transistor 320. Second additional pull up path 345 may be operably coupled between $V_{HIGH}$ and NODE B, NODE B being shown as the node located between transistor 330 and transistor 340. It should be noted that $V_{OUT}$ is also shown to be coupled with NODE A.

The voltages of NODE A and NODE B may each control the activation of one or more components of the first additional pull up path 315. For example, the additional pull up path 315 may further include transistors 316 and 317 serially coupled with each other. The operation of the first additional pull up path 315 may be enabled by the voltage on NODE B, such that the gate of transistor 316 is operably coupled with the NODE B. The operation of the first additional pull up path 315 may also be enabled by the voltage on NODE A, such that the gate of transistor 317 is operably coupled with the NODE A. With both the gate and drain of transistor 317 coupled with NODE A, transistor 317 is diode connected. As a result, transistor 317 may be activated and operate as a diode when sufficient gate to source voltage is available. Diode connected transistor 317 may be replaced by a PN-junction diode (see, e.g., FIG. 7).

Similarly, the voltages of NODE A and NODE B may each control the activation of one or more components of the second additional pull up path 345. For example, second additional pull up path 345 may further include transistors 346 and 347 serially coupled with each other. The operation of the second additional pull up path 345 may be enabled by the voltage on NODE A, such that the gate of transistor 346 is operably coupled with the NODE A. The operation of second additional pull up path 345 may also be enabled by the voltage on NODE B, such that the gate of transistor 317 is operably coupled with the NODE B. With both the gate and drain of transistor 347 coupled with NODE B, transistor 347 is diode connected. As a result, transistor 347 may be activated and operate as a diode when sufficient gate to source voltage is available. Diode connected transistor 347 may be replaced by a PN junction diode (see, e.g., FIG. 7).

In operation, the level shifter 300 may operate similarly as the level shifter 200 described in FIG. 2A during the quiescent state. During the quiescent state, the additional pull up paths 315, 345 may be deactivated because the activation of each of the additional pull up paths 315, 345 are responsive to complementary signals (e.g., NODE A and NODE B). Thus, during the quiescent state, if transistor 316 is activated then transistor 317 is deactivated, and vice versa. Similarly, during the quiescent state, if transistor 346 is activated then transistor 347 is deactivated, and vice versa. As a result, like with level shifter 200 of FIG. 2A, relatively little, to no standby current may be drawn for relatively low power operation.

The operation of level shifter 300 may, however, differ from level shifter 200 during transitions. At least one of the additional pull up paths 315, 345 may be activated when a transition occurs. For example, if $V_{IN}$ is low then the transistor 330 is activated. As a result, the voltage at NODE A is high and the voltage at NODE B is low in the quiescent state. In the quiescent state, transistor 347 is also active as a low voltage at NODE B is applied to the gate of transistor 347. Also in the quiescent state, transistor 346 and transistor 340 are inactive as a high voltage is applied to their respective gates coupled with NODE A. If $V_{IN}$ transitions to a high input, then the transistor 330 is activated, and the voltage at NODE B begins to decrease. If the drive for transistor 330 is stronger than the drive for transistor 340, then the voltage at NODE B is pulled down relatively quickly by the stronger transistor 330.

Referring now to the affect of a transition on NODE A, if $V_{IN}$ transitions to a high input, then transistor 320 is deactivated and transistor 310 and 316 are activated. Because the drive for transistor 320 is relatively stronger than transistor 310, the voltage at NODE A is pulled up relatively slowly be the weaker transistor 310. Thus, the voltage at NODE A may remain relatively low for a relatively longer period of time. As a result, transistor 317 remains active for a relatively longer period of time. Because the voltage on NODE B is pulled down more quickly than the voltage on NODE A is pulled up, transistor 316 and transistor 317 may be active momentarily at the same time. With transistor 316 and transistor 317 both active, a first switching current ($I_{SW1}$) flows through transistors 316 and 317. The first switching current ($I_{SW1}$) may assist the current from the transistor 310 in pulling up the voltage on NODE A. As the voltage on NODE A crosses a certain threshold, transistor 317 is deactivated and first switching current ($I_{SW1}$) may cease to flow. Once the transition is complete, the level shifter 300 may again be in a quiescent state.

As another example, if $V_{IN}$ transitions from a high input to a low input then level shifter 300 operates in a similar manner with the voltage on NODE A being pulled low more quickly than the voltage on NODE B. As a result, the second additional pull up path 345 is active while NODE A is being pulled up in that transistors 346 and 347 are simultaneously active. With transistors 346, 347 active, a second switching current ($I_{SW2}$) flows through transistors 346 and 347, which second switching current ($I_{SW2}$) may assist in pulling up the voltage on NODE B. As NODE B is pulled up and crosses a certain threshold, transistor 347 is deactivated and second switching current ($I_{SW2}$) may cease to flow. Once the transition is complete, the level shifter 300 may again be in a quiescent state.

Figure 3B:
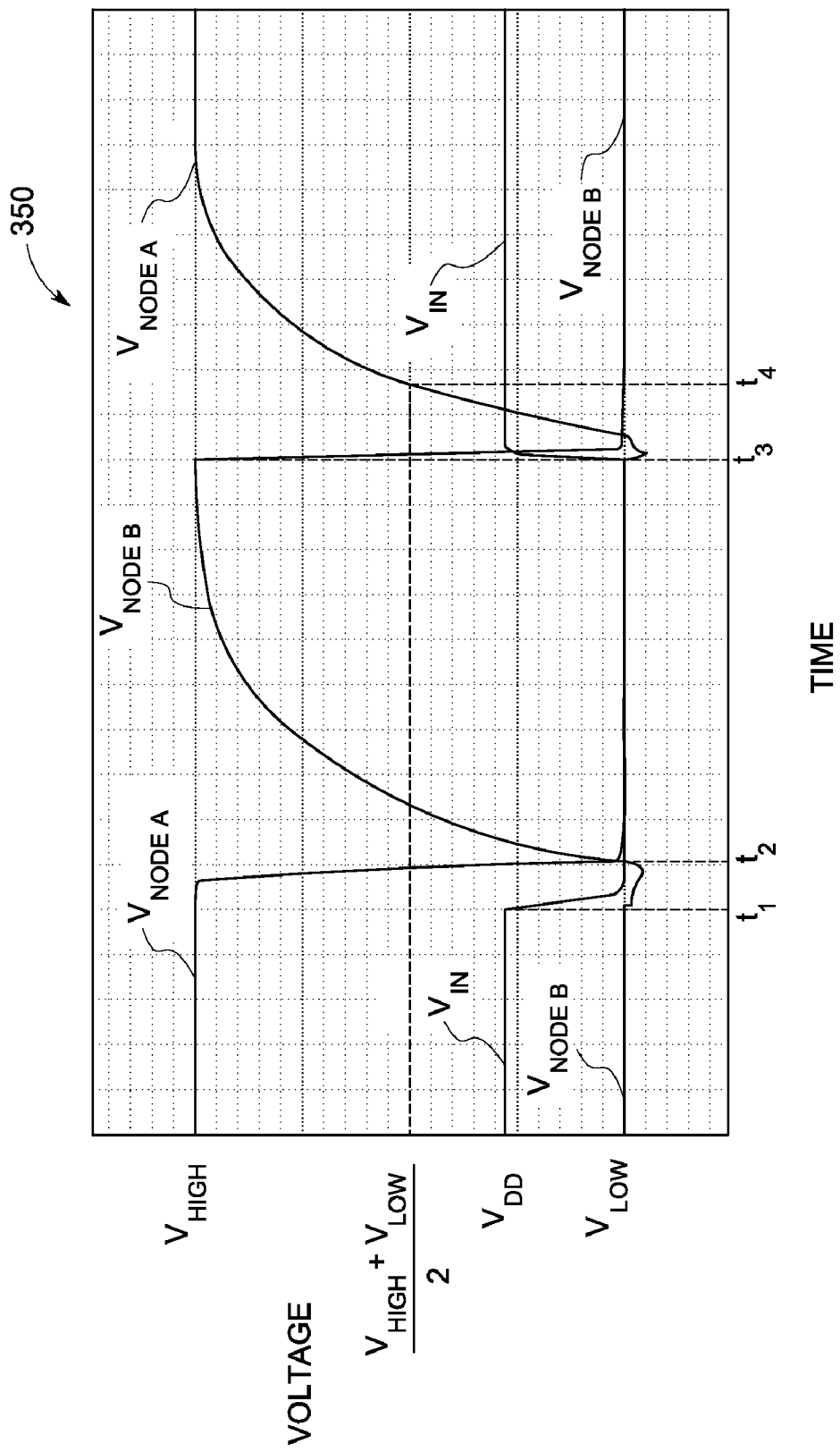
FIG. 3B is an output waveform illustrating the complementary relationship between the voltage of NODE A and the voltage of NODE B during transitions of $V_{IN}$ for the level shifter shown in FIG. 3A.

FIG. 3B is an output waveform 350 illustrating the complementary relationship between the voltage of NODE A ($V_{NODEA}$) and the voltage of NODE B ($V_{NODEB}$) during transitions of $V_{IN}$ for the level shifter 300 shown in FIG. 3A. It is noted that the output $V_{OUT}$ of level shifter 300 is coupled with NODE A. Therefore, $V_{NODEA}$ and $V_{OUT}$ are the same as shown and defined in FIG. 3A. A second output may also be coupled with NODE B as the complement of $V_{OUT}$. Outputs $V_{OUT}$ and second output coupled with NODE B may be coupled with additional circuitry, such as an inverter, that may further process the respective output signals.

Prior to time $t_1$, the level shifter 300 may be in the quiescent state when $V_{IN}$ is asserted, in which state $V_{NODEA}$ is approximately equal to $V_{HIGH}$ and $V_{NODEB}$ is approximately equal to $V_{LOW}$. At time $t_1$, $V_{IN}$ is deasserted, at which time the components within level shifter 300 operate as previously described herein. In response to $V_{IN}$ being deasserted, $V_{NODEA}$ is pulled down and $V_{NODEB}$ is pulled up. Because of the relative strength in the drives of transistors 320 and 330 relative to transistors 310 and 340, $V_{NODEA}$ is pulled down relatively quickly and $V_{NODEB}$ is pulled up relatively slowly. As illustrated in FIG. 3B, there is a time $t_2$ when both $V_{NODEA}$ and $V_{NODEB}$ are approximately equal to $V_{LOW}$. Therefore, around time $t_2$, both transistors 346 and 347 may be active and conducting to generate second switching current ($I_{SW2}$), which second switching current ($I_{SW2}$) may assist in pulling up $V_{NODEB}$. As $V_{NODEB}$ increases a threshold may be reached at which time the $V_{NODEB}$ deactivates transistor 347, and second switching current (ISW2) may cease to flow through second additional pull up path 345.

Another transition occurs at time $t_3$ when $V_{IN}$ is asserted, at which time the components within level shifter 300 operate as previously described herein. In response to $V_{IN}$ being asserted, $V_{NODEB}$ is pulled down and $V_{NODEA}$ is pulled up. Because of the relative strength in the drives of transistors 320 and 330 relative to transistors 310 and 340, $V_{NODEB}$ is pulled down relatively quickly and $V_{NODEA}$ is pulled up relatively slowly. As illustrated in FIG. 3B, there is a time $t_4$ when both $V_{NODEA}$ and $V_{NODEB}$ are approximately equal to $V_{LOW}$. Therefore, around time $t_4$, both transistors 316 and 317 may be active and conducting to generate first switching current ($I_{SW1}$), which first switching current ($I_{SW1}$) may assist in pulling up $V_{NODEA}$. As $V_{NODEA}$ increases a threshold may be reached at which time the $V_{NODEA}$ deactivates transistor 317, and first switching current ($I_{SW1}$) may cease to flow through first additional pull up path 315.

Figure 3C:
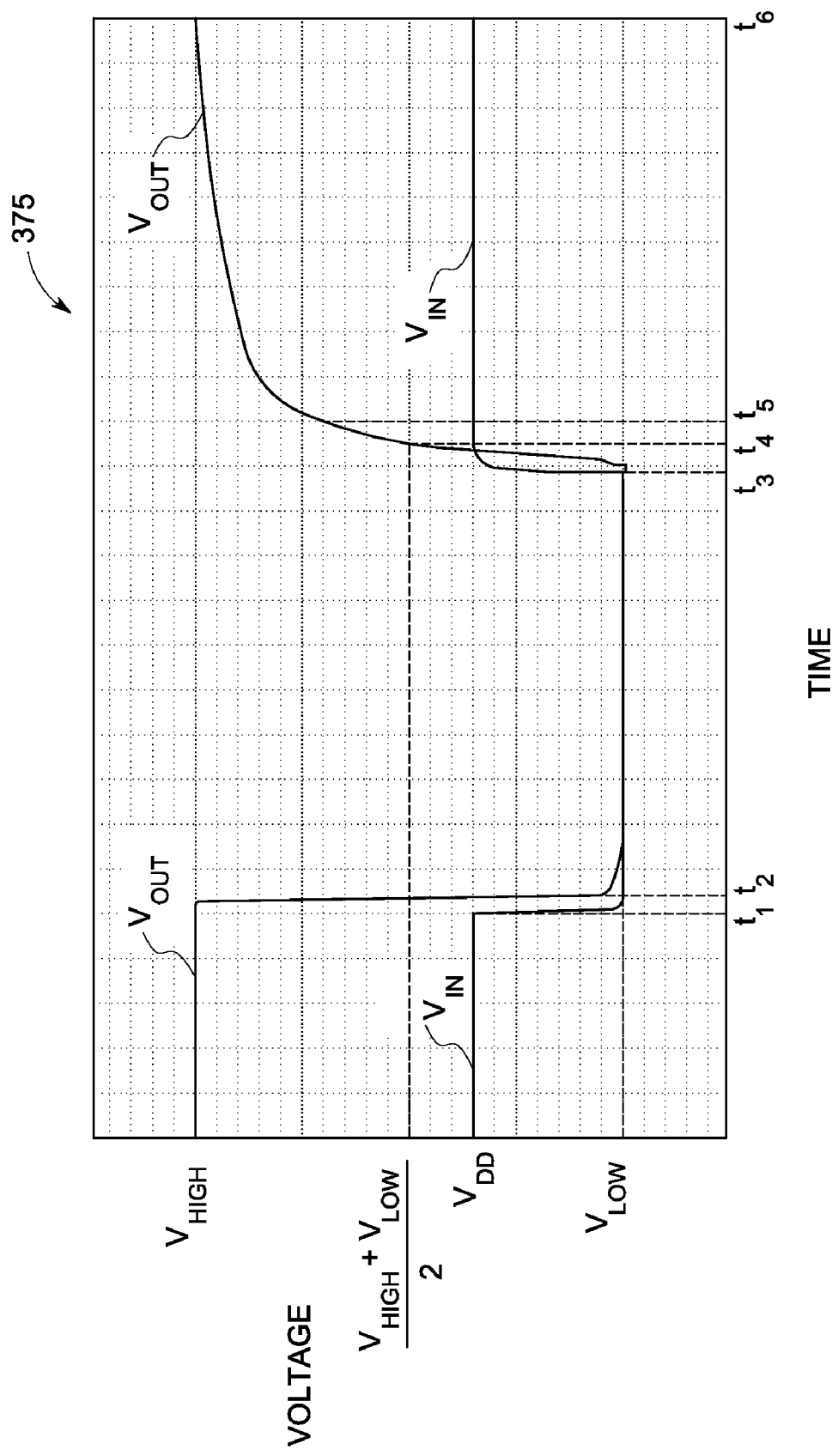
FIG. 3C is another output waveform illustrating the output signal $V_{OUT}$ being generated in response to the input signal $V_{IN}$ for the level shift circuit of FIG. 3A.

FIG. 3C is another output waveform 375 illustrating the output signal $V_{OUT}$ being generated in response to the input signal $V_{IN}$ for the level shift circuit 300 of FIG. 3A. As shown in FIG. 3C, at time $t_1$, $V_{IN}$ transitions from high to low (i.e., asserted to deasserted). For example, $V_{IN}$ may be approximately equal to $V_{DD}$ and transition to $V_{LOW}$ (e.g., 0V) at time $t_1$. As a result, $V_{OUT}$ transitions from $V_{HIGH}$ to $V_{LOW}$ at time $t_2$. The difference between the time that $V_{IN}$ transitions (i.e., $t_1$) and the time that $V_{OUT}$ transitions (i.e., $t_2$) from a high voltage to a low voltage may be the output falling time delay.

At time $t_3$, $V_{IN}$ transitions from low to high (e.g, $V_{LOW}$ to $V_{DD}$). As a result, $V_{OUT}$ transitions from low to high (e.g., $V_{LOW}$ to $V_{HIGH}$) between times $t_3$ and $t_6$. At time $t_4$, $V_{OUT}$ crosses the voltage midpoint between $V_{LOW}$ and $V_{HIGH}$, which midpoint is approximately ($V_{HIGH}+V_{LOW}$)/2. The difference between the time that $V_{IN}$ transitions (i.e., $t_3$) and the time that $V_{OUT}$ transitions (i.e., $t_6$) from a low voltage to a high voltage may be the output rising time delay. Output rising time delay may be determined from a different voltage level than time $t_6$ when $V_{OUT}$ is approximately equal to $V_{HIGH}$. For example, one measure of the output rising time delay may be considered when $V_{OUT}$ crosses the voltage midpoint between $V_{LOW}$ and $V_{HIGH}$ (i.e., at time $t_4$).

In contrast to the performance of the level shifter 200 of FIG. 2A, $V_{OUT}$ may be pulled up by level shifter 300 of FIG. 3A more quickly. For example, the slope of $V_{OUT}$ is relatively steeper than through other methods.

Referring again to FIG. 3A, designing for minimum shoot-through current, the transistors 310 and 340 are configured to be weaker with respect to the drives of transistors 320, 330. Thus, transistors 320 and 330 have large drive with respect to transistors 310, 340 so that the voltages at NODE A and NODE B are pulled down quickly. Transistors 316, 317, 346, and 347 may have drives that are approximately equal to the relatively weak drives of pull up transistors 310, 340. Alternatively, one or more of transistors 316, 317, 346, and 347 may have drives that are relatively strong in relation to the other transistors of the level shifter 300.

If the additional pull up paths 315, 345 are activated, the additional pull up path 315 assists the pull up transistor 310 in pulling up NODE A. In other words, first additional pull up path 315 is inactive during a falling transition on NODE A, and active during a rising transition of NODE A. Likewise, second additional pull up path 345 is inactive during a falling transition on NODE B, and active during a rising transition on NODE B. Because the second additional pull up path 345 is inactive during a falling transition of NODE B, the output falling skew seen in the output waveform 275 of FIG. 2C is avoided. Meanwhile, the action of these new devices may improve rising time performance by increasing the available current to charge parasitic capacitance on the $V_{OUT}$ node.

Figure 4:
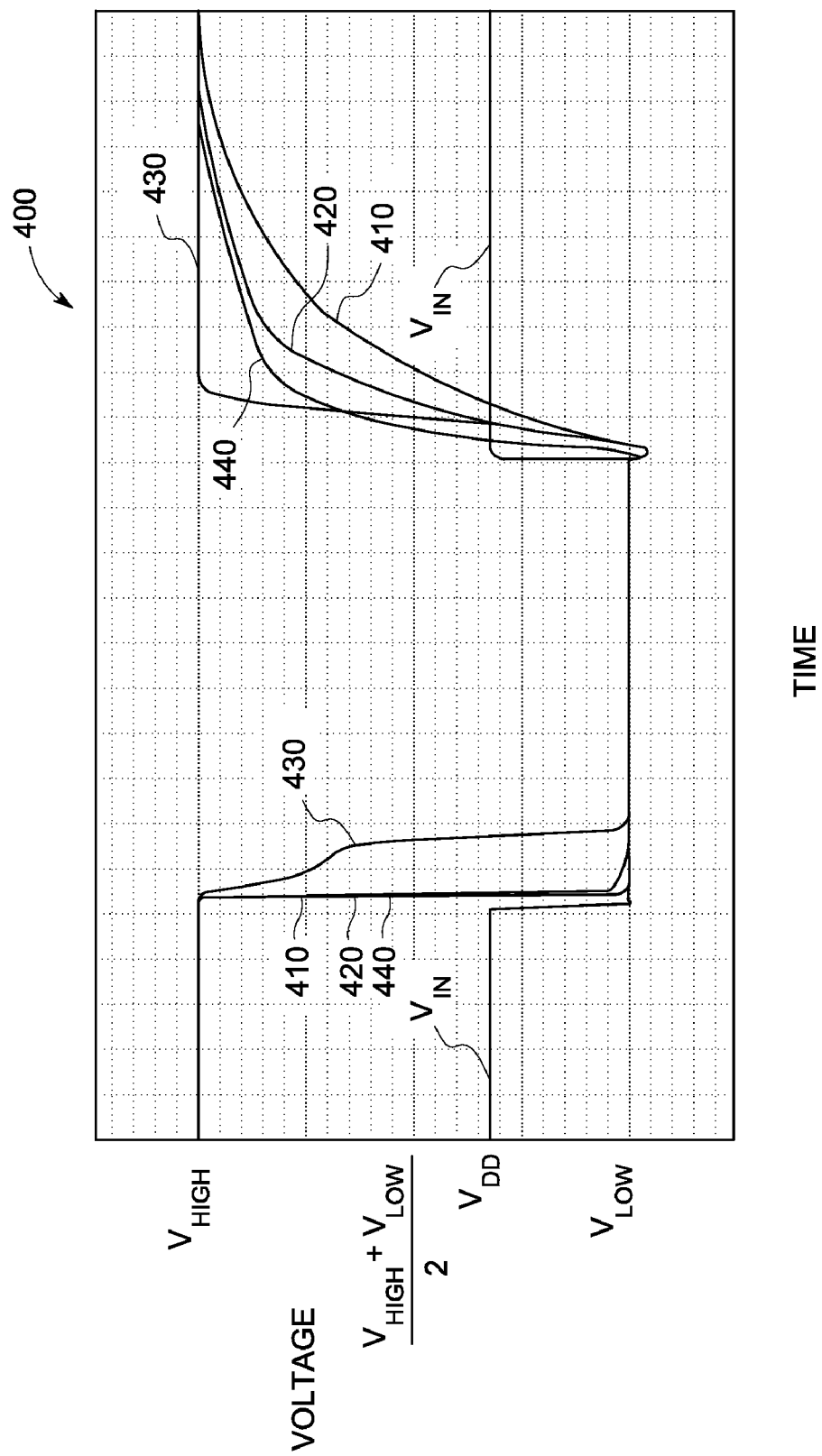
FIG. 4 is an output waveform illustrating different output voltages for various level shifters responsive to an input voltage signal $V_{IN}$.

FIG. 4 is an output waveform 400 illustrating different output voltages for various level shifters responsive to an input voltage signal $V_{IN}$. For example, line 410 may represent output voltage signal $V_{OUT}$ for the level shifter configuration of FIG. 1A. Line 420 may represent output voltage signal $V_{OUT}$ for the level shifter configuration of FIG. 2A. Line 430 may represent output voltage signal $V_{OUT}$ for the level shifter configuration of FIG. 2A with the hold transistors being altered to have a lower drive characteristic than the other transistors as described with reference to FIG. 2C. Line 440 may represent output voltage signal $V_{OUT}$ for the level shifter configuration of FIG. 3A.

During a transition from high to low, lines 410, 420, and 440 indicate that the corresponding level shifter configurations each have relatively short output falling time delays. As previously described with reference to FIG. 2C, the modified level shifter 200 may have a relatively longer output falling time delay as shown by line 430.

During a transition from low to high, lines 410 and 420 indicate that the corresponding level shifter configurations each have relatively long output rising time delays. As previously described with reference to FIG. 2C, the modified level shifter 200 may have a relatively short output rising time delay, which shorter output rising time delay may come at the cost of a longer output falling time delay. However, line 440 indicates that the output rising time delay for the level shifter 300 of FIG. 3A is relatively short compared with the other level shifter configurations, while maintaining a relatively short output falling time delay. In fact, as indicated by line 440, the $V_{OUT}$ of level shifter 300 of FIG. 3A may reach the midpoint $(V_{HIGH}+V_{LOW})/2$ relatively faster than the other level configurations shown. As a result, the output signal $V_{OUT}$ may be operably coupled with a follow on digital stage (e.g., digital inverter) that will switch relatively quickly as $V_{OUT}$ reaches the midpoint relatively quickly. Of course, NODE B may also be operably coupled with a follow on digital stage as an output signal.

Figure 5A:
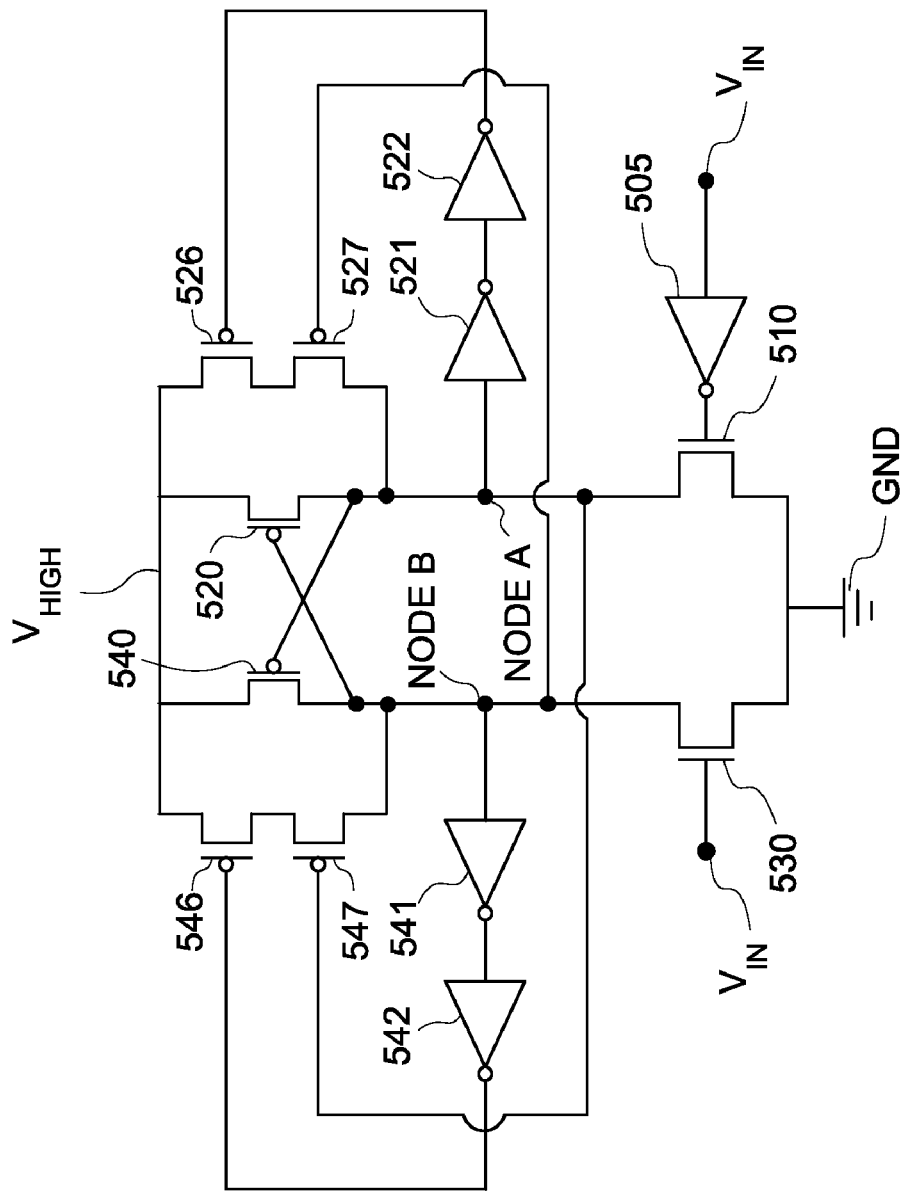
FIG. 5A is a schematic diagram of a level shifter as known in the art as an attempt to provide a solution for some of the problems described herein.

FIG. 5A is a schematic diagram of a level shifter 500 as known in the art as an attempt to provide a solution for some of the problems described herein. Level shifter 500 may include transistors 510, 520, 530, 540, and inverter 505 configured in a similar manner as the level shifter 200 of FIG. 2A.

Level shifter 500 further includes transistors 526, 527 serially coupled with each other and coupled between $V_{HIGH}$ and NODE A. Likewise, level shifter 500 includes transistors 546, 547 serially coupled with each other and coupled between $V_{HIGH}$ and NODE B. NODE A is further coupled with a series of inverters 521, 522 that act as delay buffers to control the gate of transistor 526. NODE B is further coupled with a series of inverters 541, 542 that act as delay buffers to control the gate of transistor 546.

In operation, when NODE A transitions from a low voltage to a high voltage, a $V_{IN}$ with a low voltage swing (e.g., 0-3V) is shifted to a higher voltage with a higher voltage swing (e.g., 0-12V) on $V_{OUT}$. While the level shifter 500 may have a similar operation in the quiescent state as the level shifter 200 of FIG. 2A and level shifter 300 of FIG. 3A, the performance of the level shifter 500 may be deficient during transitions of $V_{IN}$. For example, the transistors 526, 527 may both momentarily be on in order to assist in pulling up the voltage on NODE A. As NODE A raises past a certain threshold, the output of the inverters 521, 522 causes the transistor 526 to deactivate. As a result, transistors 526, 527 ceases to assist in pulling up NODE A. The inverters 526, 527 may act to delay the deactivation of transistor 526 allowing current flowing through transistors 526, 527 to assist longer in pulling up NODE A. However, when NODE A transitions and is pulled down by transistor 510, the inverters 521, 522 may introduce undesirable delay in the pull down time. Relying on using inverters 521, 522, 541, 542 to drive and control activation of transistors 526, 546 may require complex power regulation schemes for low voltage transistors of the inverters 521, 522, 541, 542 if an offset condition is desirable as will be shown in embodiments of the present invention in FIG. 6A. Furthermore, adding additional circuitry, such as inverters 521, 522, 541, 544 may further add to the complexity and size of the level shifter 500 when fabricated.

Additionally, it should be noted that NODE A controls the activation of transistor 526, which transistor 526 is connected to $V_{HIGH}$. As a result, relying on NODE A to turn off transistor 526 rather than transistor 527 may further introduce delay in the transition delays. Likewise, controlling the activation of transistor 526 with NODE B may further introduce transition delays.

Figure 5B:
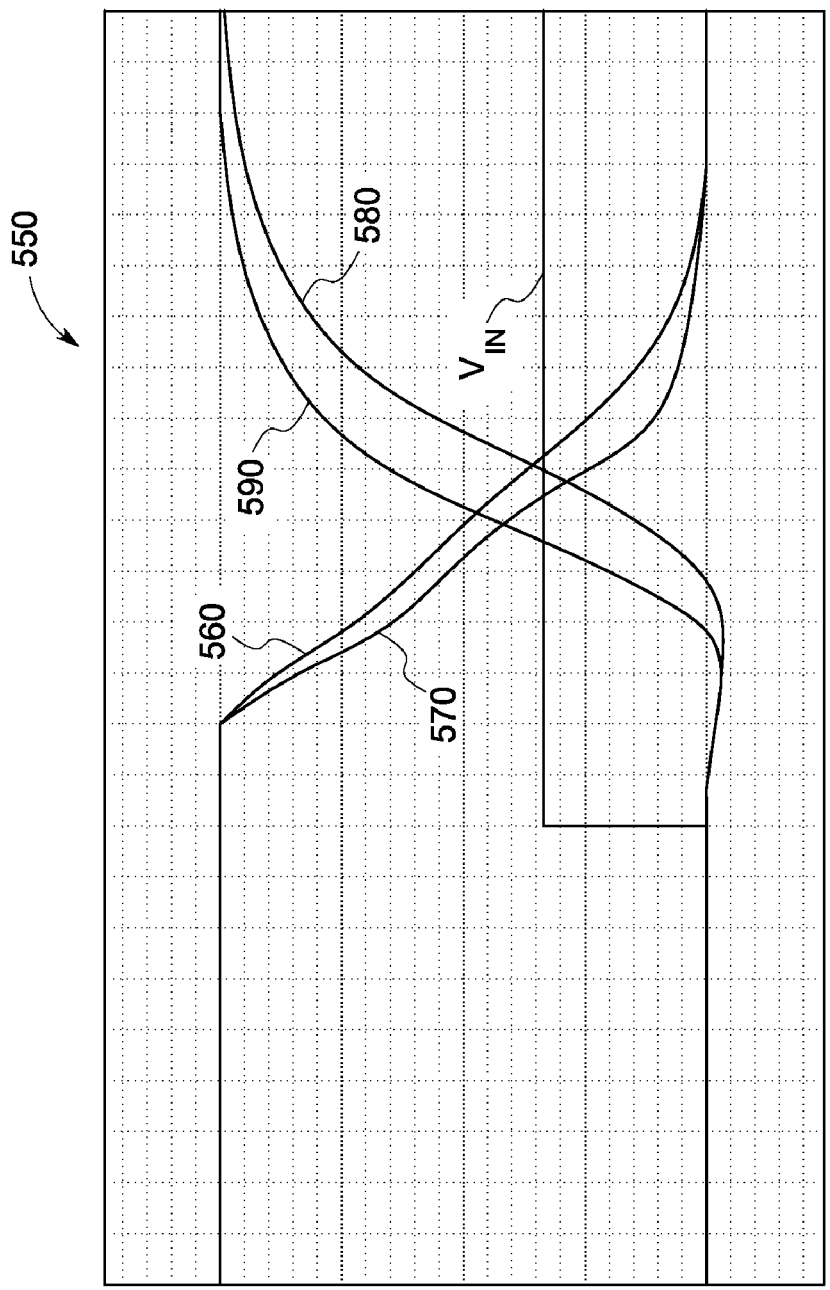
FIG. 5B is an output waveform illustrating different output voltages for the level shifter of FIG. 5A in comparison to the level shifter of FIG. 3A responsive to an input voltage signal $V_{IN}$.

FIG. 5B is an output waveform 550 illustrating different output voltages for the level shifter 500 of FIG. 5A in comparison to the level shifter 300 of FIG. 3A responsive to an input voltage signal $V_{IN}$. For example, line 560 may represent the voltage of NODE B for level shifter 500 of FIG. 5A. Line 570 may represent output voltage of NODA A for the level shifter 300 of FIG. 3A. Line 580 may represent the voltage of NODE B for level shifter 500 of FIG. 5A. Line 590 may represent output voltage of NODA A for the level shifter 300 of FIG. 3A.

During a $V_{IN}$ transition from high to low, comparing the voltage signal represented by line 570 with the voltage signal represented by line 560 indicates that the voltage level shifter configuration of FIG. 3A may have a relatively short output falling time delay in comparison to the voltage level shifter configuration of FIG. 5A. In other words, the voltage of NODE B for FIG. 3A may be pulled down relatively faster than the voltage of NODE B for FIG. 5A.

During a $V_{IN}$ transition from low to high, comparing the voltage signal represented by line 590 with the voltage signal represented by line 580 indicates that the voltage level shifter of FIG. 3A may also have a relatively short output rising time delay in comparison to the voltage level shifter configuration of FIG. 5A. In other words, the voltage of NODE A for FIG. 3A may be pulled up relatively faster than the voltage of NODE A for FIG. 5A. While not shown, the output falling time delay may be reduced for NODE A and the output rising time delay may be reduced for NODE B by employing the voltage level shifter configuration of FIG. 3A in comparison to the voltage level shifter configuration of FIG. 5A.

Figure 6A:
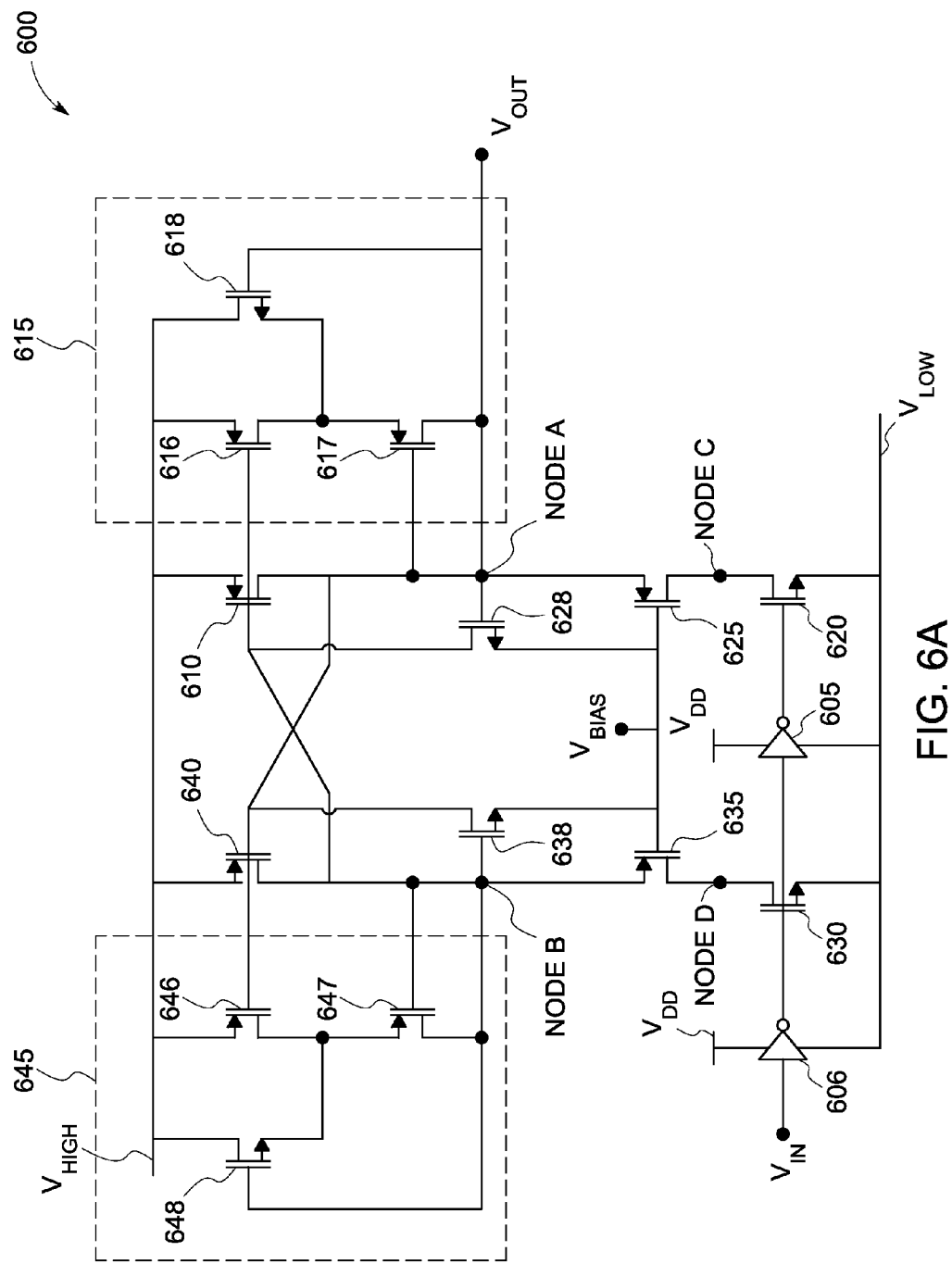
FIG. 6A is a schematic diagram of a level shifter according to another embodiment of the present invention.

FIG. 6A is a schematic diagram of a level shifter 600 according to another embodiment of the present invention. Level shifter 600 includes pull down transistors 620, 630, pull up transistors 610, 640, and additional pull up paths 615, 645. Additional pull up paths 615, 645 include transistors 616-618 and transistors 646-648, respectively. Level shifter 600 further includes bias transistors 625, 635 and transistors 628, 638. Transistors 618, 628, 638, 648 may also be referred to as clamp transistors. Level shifter 600 may include inverters 605, 606 configured to receiving and deliver $V_{IN}$ to the transistors 620, 630. As shown in other embodiments herein, fewer inverters may be acceptable. Utilizing two inverters may introduce an inverted output $V_{OUT}$ as compared to the input $V_{IN}$ (see e.g., FIG. 6B).

Bias transistor 625 may be operably coupled between first pull up transistor 610 and first pull down transistor 620 such that the drain of first pull down transistor 620 is coupled with the drain of bias transistor 625, and the source of bias transistor 625 is coupled with the drain of first pull up transistor 610. Likewise, the drains of second pull down transistor 630 and bias transistor 635 may be coupled, and the source of bias transistor 635 and the drain of second pull up transistor 640 may be coupled. First and second pull up transistors 610, 640 may be cross-coupled such that the gate of each transistor is coupled with the drain of the other transistor.

The sources of the first and second pull up transistors 610, 640 may be coupled with $V_{HIGH}$, the sources of the first and second pull down transistors 620, 630 may be coupled with $V_{LOW}$. $V_{BIAS}$ may be a voltage that is between $V_{HIGH}$ and $V_{LOW}$. As a result, the level shifter 600 may be configured to shift a low voltage signal ($V_{IN}$) in one voltage domain (e.g., with a low voltage swing from 0V to 5V) to a low voltage signal in another voltage domain (e.g., with a low voltage swing from 35V to 40V) that is offset by another voltage (e.g., $V_{BIAS}$). With the example voltage listed above, $V_{HIGH}$ may be 40V, $V_{BIAS}$ may be 35V, $V_{DD}$ may be 5V, and $V_{IN}$ may switch between 0V and 5V.

As an exemplary operation of level shifter 600, if transistor 630 is deactivated, current may not be conducted through transistor 630. With the gate of bias transistor 635 coupled with $V_{BIAS}$, and little, to no, current conducting through transistor 630, the voltage on the drain of bias transistor 635

(NODE D) may not be able to be pulled down to $V_{LOW}$. If NODE D cannot be pulled down to $L_{LOW}$, then bias transistor 635 may also be deactivated. As a result, NODE B is approximately equal to $V_{HIGH}$. If transistor 630 is deactivated, transistor 620 is activated. With transistor 620 activated, then current is conducted through transistor 620, which current pulls down the voltage on the drain of bias transistor 625 (NODE C) to be approximately equal to $V_{LOW}$. If sufficient current exists on the source of bias transistor 625, bias transistor 625 pulls down NODE A to the extent that NODE A cannot be pulled lower than the gate voltage ($V_{BIAS}$) of bias transistor 625 before turning itself off. A similar operation occurs at the next input transition in which NODE A transitions to be approximately $V_{HIGH}$, and NODE B transitions to be approximately equal to $V_{BIAS}$.

Thus, depending on the values chosen for $V_{HIGH}$, $V_{LOW}$, and $V_{BIAS}$, the level shifter 600 may be configured to perform level shifting in a variety of different ways. For example, an input voltage with a low voltage swing (e.g., 0-3V) may be shifted to a low voltage swing with a voltage offset (e.g., 37-40V). Alternatively level shifter 600 may shift a voltage down (e.g., from 5V to 2V). Thus, the voltage levels may be shifted between a low voltage to a high voltage, a first high voltage to a second high voltage, a first low voltage to a second low voltage, a high voltage to a low voltage. Additionally, the range of the input and output voltage swings may vary depending on the voltages used for $V_{IN}$, $V_{BIAS}$, and $V_{HIGH}$. For example, an input signal ($V_{IN}$) may have a voltage swing of 5V and have an output signal ($V_{OUT}$) with a voltage swing of 2V. Other variations thereof are also contemplated where a first input has a first voltage swing and is output as a second voltage swing different from the first voltage swing. Voltages are also contemplated in which $V_{IN}$, $V_{BIAS}$, $V_{HIGH}$, or combinations thereof may include negative voltages (e.g., an output swing from −15V to −20V).

Because each of the transistors 610, 616-618, 628, 638, 640, 646-648 may have a relative low voltage swing, each of the transistors 610, 616, 617, 640, 646, 647 may be low voltage devices. Likewise, the transistors (not shown) used to construct inverters 605, 606 may be also low voltage devices. Transistors 620, 630 and bias transistors 625, 635 may experience voltage swings over the entire voltage range ($V_{LOW}$ to $V_{HIGH}$) and may be high voltage devices relative to the transistors 610, 616-618, 628, 638, 640, 646-648

Additionally, transistors 610, 616-618, 628, 638, 640, 646-618 may include isolated transistors configured to isolate the epitaxial layer and the body of each transistor. Employing one or more isolated transistors may have the effect of assisting the low voltage devices in staying within their safe operating voltage range while in an offset condition. Each isolated transistor may have additional terminals in addition to the gate, drain, and source terminals shown. Alternatively, one or more of the isolated transistors may have the isolated regions without need of additional terminals such that the construction of the transistor itself is inherently self-isolating.

The nodes between transistors 616 and 617, and between transistors 646 and 647 may experience a high impedance and may experience voltages outside of the safe operating regions of the transistors that damage the oxide of the transistors. These nodes may also experience capacitive coupling from nearby metal lines experiencing a voltage transition. Such capacitive coupling may introduce parasitic capacitance at the node causing a voltage greater than the safe operating range of the low voltage transistors. Other events may also cause nodes to operate outside of safe operating ranges, such as voltage transients on $V_{HIGH}$.

Clamp transistors 618, 648 may protect the nodes between transistors 616 and 618, and between transistors 646 and 647. For example, clamp transistor 618 may be coupled between $V_{HIGH}$ and the node between transistors 616 and 617. The source of clamp transistor 618 may be coupled at the node between transistors 616 and 617, and the drain of clamp transistor 618 may be coupled with $V_{HIGH}$. The gate of clamp transistor 618 may be coupled with and controlled by NODE A. Likewise, clamp transistor 648 may be coupled between $V_{HIGH}$ and the node between transistors 646 and 647. The source of clamp transistor 648 may be coupled at the node between transistors 646 and 647, and the drain of clamp transistor 648 may be coupled with $V_{HIGH}$. The gate of clamp transistor 648 may be coupled with and controlled by NODE B. As a result, gate to source connections of clamp transistors 618, 648 act as a follower to prevent the respective high impedance node from going too low, and the drain to source connections of clamp transistors 618, 648 act to prevent the high impedance nodes from going too high.

NODES A and B may also experience high voltages such that it may be desirable to have clamps that protect the low voltage transistors from experiencing voltages outside of their respective safe operating regions. Thus, clamp transistor 628 may be coupled between NODE B and $V_{BIAS}$. The source of clamp transistor 628 may be coupled with $V_{BIAS}$ and the drain of clamp transistor may be coupled with NODE B. The gate of clamp transistor 628 may be coupled with and controlled by NODE A. As a result, the drain of clamp transistor 628 may be configured to keep NODE B within a safe operating region.

Likewise, clamp transistor 638 may be coupled between NODE A and $V_{BIAS}$. The source of clamp transistor 638 may be coupled with $V_{BIAS}$ and the drain of clamp transistor may be coupled with NODE A. The gate of clamp transistor 628 may be coupled with and controlled by NODE B. As a result, the drain of clamp transistor 638 may be configured to keep NODE A within a safe operating region.

Figure 6B:
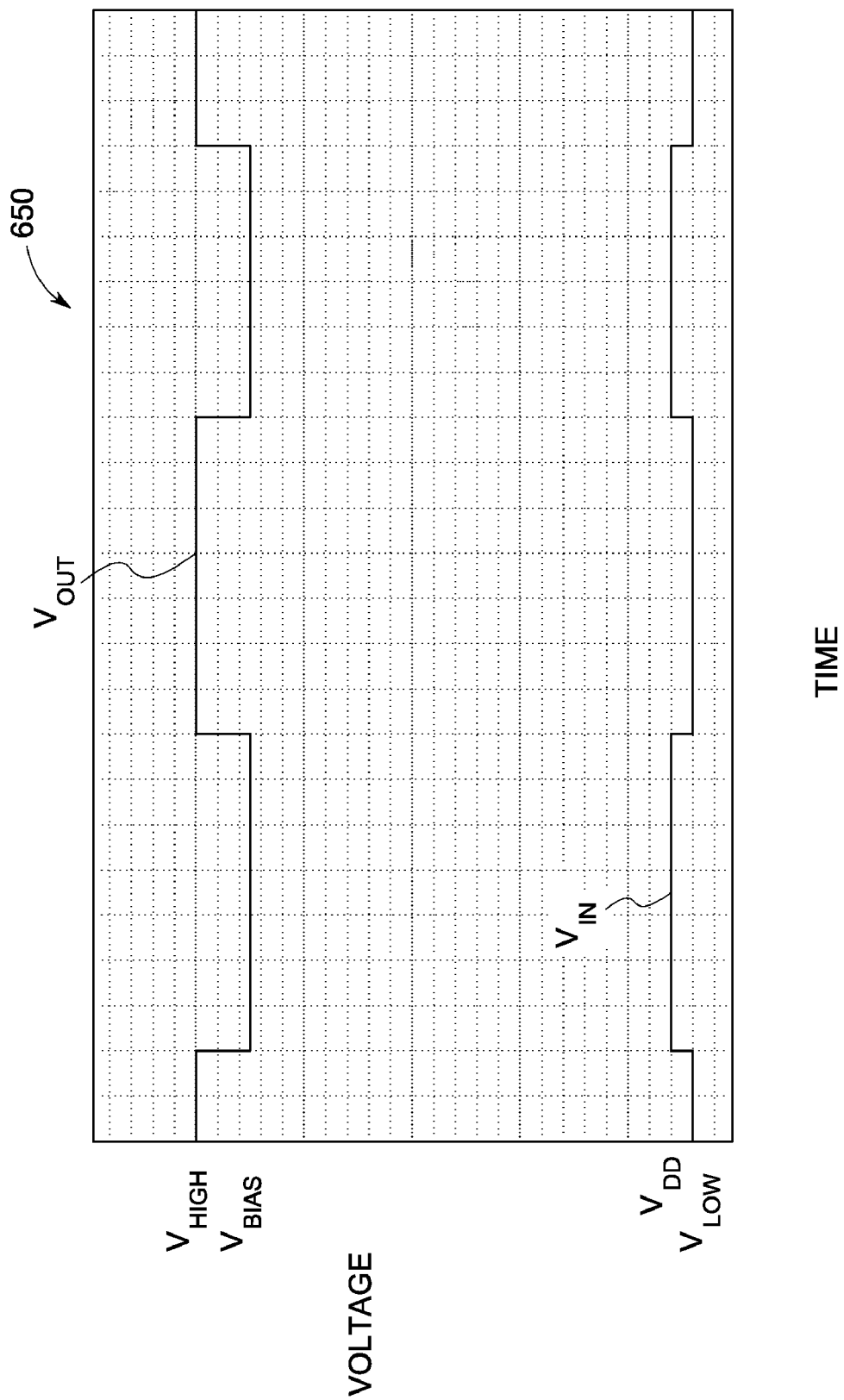
FIG. 6B is an output waveform illustrating the output signal $V_{OUT}$ being generated in response to the input signal $V_{IN}$ for the level shifter of FIG. 6A.

FIG. 6B is an output waveform 650 illustrating the output signal $V_{OUT}$ being generated in response to the input signal $V_{IN}$ for the level shifter 600 of FIG. 6A. As shown in FIG. 6B, the bias voltage ($V_{BIAS}$) shifts $V_{IN}$ to a $V_{OUT}$ with a different voltage domain. $V_{IN}$ has a low voltage swing between $V_{LOW}$ and $V_{DD}$. $V_{OUT}$ also has a low voltage swing that is offset by $V_{BIAS}$. As a result, $V_{OUT}$ has a low voltage swing between $V_{BIAS}$ and $V_{HIGH}$. As previously discussed, the configuration of level shifter 600 of FIG. 6A may result in a wide variety of output combinations by altering the values of $V_{IN}$, $V_{BIAS}$, and $V_{HIGH}$. While the voltage swings may be low voltage swings, it is not necessary that the voltage swing of $V_{OUT}$ be equal to the voltage swing of the $V_{IN}$. The voltages described in FIG. 6B may also be positive or negative. As also described herein, high voltage swings are also contemplated as embodiments of the present invention.

Figure 7:
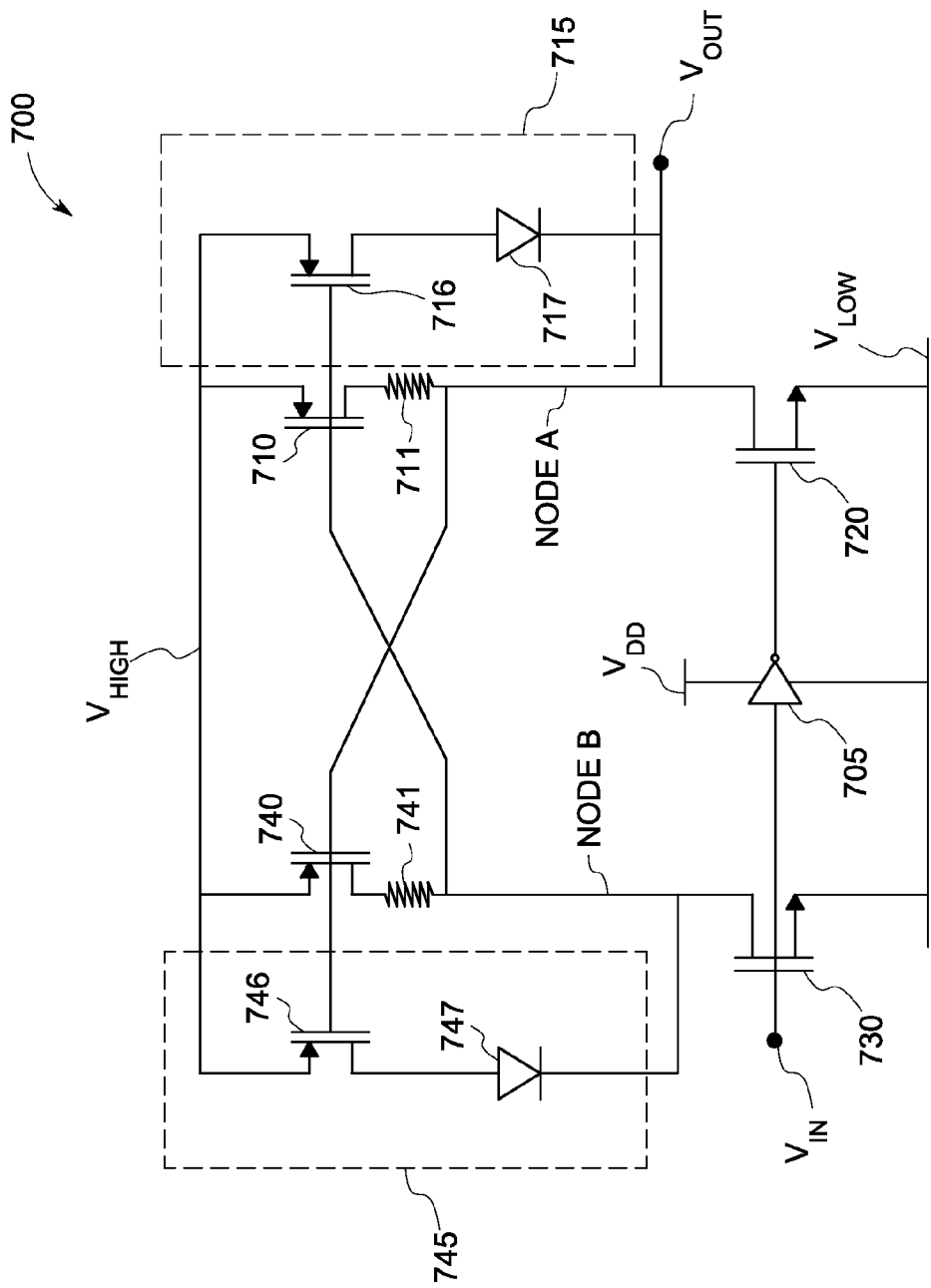
FIG. 7 is a schematic diagram of a level shifter according to another embodiment of the present invention.

FIG. 7 is a schematic diagram of a level shifter 700 according to another embodiment of the present invention. Level shifter 700 may include pull up transistors 710, 740, pull down transistors 720, 730, inverter 705, additional pull up paths 715, 745, which components may be configured in a similar manner as described with reference to the level shifter 300 of FIG. 3A. Level shifter 700 may further include resistors 711, 741 coupled in series with the drains of pull up transistors 710, 740, respectively. As described herein, embodiments of the present invention include strong pull down transistors 720, 730 relative to weaker pull up transistors 710, 740. That is, the relative drive strength of the pull down transistors 720, 730 may be greater than the relative drive strength of the pull up transistors 710, 740. The drive strength of a transistor may be weakened by having a small gate width and a large gate length relative to the gate of a stronger transistor. In other words, the drive strength of a transistor may also be strengthened by having a large gate width and a small gate length relative to the gate of a weaker transistor.

The pull up strength of transistors 710, 740 may be effectively weakened by coupling resistors 711, 741 to the drains of transistors 710, 740. Thus, resistors 711, 741 may effectively weaken the pull up strength of transistors 710, 740 relative to the pull down of the pull down transistors 720, 730. With the resistors 711, 741, coupled to the trains of transistors 710, 740, the ability of each transistor (e.g., 710) to hold the gate of the other cross-coupled transistor (e.g., 740) high. As a result, the desired relative pull up and pull down strength between transistors 710, 720 and transistors 740, 730 may also be accomplished by choosing the appropriate relative dimensions of the gate lengths and widths of the transistors 710, 720, 730, 740 and also by coupling resistors 711, 741 with the drains of the pull up transistors 710, 740 and prior to the cross coupled gate connections to NODES A and B, through other methods, or through combinations thereof.

Other embodiments may include the different configurations for additional pull up paths 715, 745. For example, first additional pull up path 715 may include a diode 717 coupled with the drain of transistor 716 and NODE A. Second additional pull up path 745 may also include a diode 747 coupled with the drain of transistor 746 and NODE B. In operation, if NODE A is, for example, high, then transistors 710 and 716 may be active and diode 717 may be inactive. As a result of diode 717 being inactive, the pull up action of transistor 716 may be blocked. If VIN transitions to low, NODE A may be pulled low by pull down transistor 720 against pull up transistor 710 until diode 717 turns on. At that time, the gate to source voltage of pull up transistor 740 increases, which may activate pull up transistor 740 and deactivate pull up transistor 710 and transistor 716. In effect, pull up transistors 710 and 716 are turning off while diode 717 is turning on. Output falling time delay may be reduced as diode 717 blocks transistor 716 from turning on. If NODE A is low, diode 717 may conduct whenever 717 is activated and thereby allows diode 717 to increase the pull up of NODE A, which may reduce output rising time delay.

While the transistors shown in the illustrative figures show particular transistor types and processes, embodiments of the present invention are not limited to those shown. For example, referring again to FIG. 6A, transistors 610, 616, 617, 625, 635, 640, 646, 647 are shown in FIG. 6A to be PMOS transistors while transistors 618, 620, 628, 630, 638, 648 are shown to be NMOS transistors. Other embodiments may include variations such that one or more transistors is a complement of that shown (e.g., NMOS instead of PMOS and vice versa). Additionally, while transistors are shown to be constructed according to MOSFET processes, other processes may also be implemented, including, for example, BJT, GaAs, and other semiconductor processes as known in the art.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method for shifting an input voltage level to a different output voltage level, the method comprising:
    pulling down a voltage on an output node of a level shifter in a relatively faster manner than pulling up a voltage on an output node responsive to an input signal;
    pulling up a voltage on the output node with at least both of a pull up transistor and an additional pull up path responsive to the input signal;
    turning off the additional pull up path as a voltage on the output node increases above a threshold level, wherein turning off the additional pull up path is accomplished through a direct connection between the output node and a gate of a control transistor of the additional pull up path; and
    generating a voltage level shifted output on the output node that is a voltage level different than the input signal.

2. The method of claim 1, wherein generating a voltage level shifted output includes resulting in a voltage level shifted output with a voltage swing that is different than a voltage swing of the input signal.

3. The method of claim 1, wherein generating a voltage level shifted output includes resulting in a voltage level shifted output with a voltage swing that is the same as a voltage swing of the input signal.

4. The method of claim 1, wherein generating a voltage level shifted output includes resulting in a voltage level shifted output with a voltage swing that includes at least one negative voltage.

5. The method of claim 1, wherein pulling down a voltage on an output node of a level shifter in a relatively faster manner than pulling up a voltage on an output node comprises:
    deactivating a pull up transistor with a relatively small gate width and a large gate length relative to a gate of a pull down transistor; and
    activating the pull down transistor.

6. A level shifting circuit, comprising:
    a first node coupling a first pull up circuit and a first pull down circuit, wherein:
        the first pull down circuit is responsive to an input signal; and
        the first pull up circuit is further coupled to a high voltage signal and the first pull down circuit is coupled to a low voltage signal;
    a first additional pull up path including a first transistor serially coupled with a second device configured as a diode and coupled with the first node, the second device configured to control the activation of the first additional pull up path during a transition from low to high on the first node; and
    an output signal associated with the first node, wherein the output signal is configured to generate a level shifted voltage in response to the input signal.

7. The level shifting circuit of claim 6, wherein the second device configured as a diode includes a second transistor coupled to the first node, wherein a gate of the second transistor is also directly coupled to the first node.

* * * * *